(12) United States Patent
Lai et al.

(10) Patent No.: US 10,950,502 B2
(45) Date of Patent: Mar. 16, 2021

(54) METHOD OF MANUFACTURING A CHIP PACKAGE

(71) Applicant: Comchip Technology Co., Ltd., New Taipei (TW)

(72) Inventors: Chien-Chih Lai, New Taipei (TW); Hung-Wen Lin, New Taipei (TW)

(73) Assignee: Comchip Technology Co., Ltd., New Taipei (TW)

( * ) Notice: Subject to any disclaimer, the term of this patent is extended or adjusted under 35 U.S.C. 154(b) by 0 days.

(21) Appl. No.: 16/403,624

(22) Filed: May 6, 2019

(65) Prior Publication Data

US 2020/0161182 A1 May 21, 2020

(30) Foreign Application Priority Data

Nov. 16, 2018 (TW) .................................. 107140903

(51) Int. Cl.
*H01L 21/78* (2006.01)
*H01L 21/56* (2006.01)
*H01L 21/683* (2006.01)

(52) U.S. Cl.
CPC ............ *H01L 21/78* (2013.01); *H01L 21/561* (2013.01); *H01L 21/568* (2013.01); *H01L 21/6836* (2013.01); *H01L 2221/68368* (2013.01); *H01L 2221/68381* (2013.01)

(58) Field of Classification Search
CPC ..... H01L 21/568; H01L 21/561; H01L 24/83; H01L 24/29; H01L 21/78; H01L 21/6836; H01L 23/3114; H01L 2224/73204; H01L 2224/73253; H01L 2221/6834; H01L 2221/68368; H01L 2221/68381
See application file for complete search history.

(56) References Cited

U.S. PATENT DOCUMENTS

| | | | |
|---|---|---|---|
| 2007/0141330 A1* | 6/2007 | Morishima | ......... H01L 21/6836 428/343 |
| 2017/0271276 A1* | 9/2017 | Ho | ........................ H01L 23/544 |

* cited by examiner

*Primary Examiner* — Caridad Everhart
(74) *Attorney, Agent, or Firm* — CKC & Partners Co., LLC

(57) ABSTRACT

A method for manufacturing chip package is disclosed. The method includes providing a wafer having conductive bumps disposed on a first surface; forming a first adhesion layer and a first carrier board; thinning the wafer; forming a first insulating layer; forming a second adhesion layer and a second carrier board; heating the first adhesion layer to a first temperature to remove the first carrier board and the first adhesion layer; forming trenches; forming a third adhesion layer and a third carrier board; heating the second adhesion layer to a second temperature to remove the second carrier board and the second adhesion layer; forming a second insulating layer filling the trenches; heating the third adhesion layer to a third temperature to remove the third carrier board and the third adhesion layer; and dicing the first insulating layer and the second insulating layer along each trench.

11 Claims, 7 Drawing Sheets

METHOD OF MANUFACTURING A CHIP PACKAGE

CROSS-REFERENCE TO RELATED APPLICATION

This application claims priority to Taiwan Application Serial Number 107140903, filed Nov. 16, 2018, which is herein incorporated by reference.

BACKGROUND

Field of Invention

The present invention relates to a method of manufacturing a chip package.

Description of Related Art

In one conventional chip packaging process, semiconductor dies are formed by dicing a wafer and are packaged one by one, which is quite time-consuming and complicated. In an alternative process, a plurality of chip packages is formed by arranging the semiconductor dies one by one on a carrier board, followed by performing a packaging process and a dicing process. This method of manufacturing chip packages is time-consuming and complicated as well, and an alignment offset issue is likely to occur.

SUMMARY

In view of this, one purpose of the present invention is to provide a method of manufacturing a chip package to address the abovementioned issues.

One aspect of the present invention is to provide a method of manufacturing a chip package. The method includes steps of: providing a wafer having a first surface and a second surface opposite thereto, in which the wafer comprises a plurality of conductive bumps disposed on the first surface; forming a first adhesion layer and a first carrier board covering the conductive bumps and the first surface, in which the first adhesion layer is disposed between the first carrier board and the first surface; thinning the wafer from the second surface toward the first surface; forming a first insulating layer covering the second surface; forming a second adhesion layer and a second carrier board covering the first insulating layer, in which the second adhesion layer is disposed between the second carrier board and the first insulating layer; heating the first adhesion layer to a first temperature, such that the first carrier board and the first adhesion layer are removed; forming a plurality of trenches penetrating through the wafer; forming a third adhesion layer and a third carrier board covering the conductive bumps, in which the third adhesion layer is disposed between the third carrier board and the conductive bumps; heating the second adhesion layer to a second temperature, such that the second carrier board and the second adhesion layer are removed; forming a second insulating layer filling the trenches and covering the first surface; heating the third adhesion layer to a third temperature, such that the third carrier board and the third adhesion layer are removed; and dicing the first insulating layer and the second insulating layer along each trench to form a plurality of chip packages.

According to one embodiment of the present invention, during the step of forming the second insulating layer, the second insulating layer further covers a sidewall of the wafer and a sidewall of the second insulating layer.

According to one embodiment of the present invention, the first temperature ranges from 70° C. to 90° C.

According to one embodiment of the present invention, the second temperature ranges from 110° C. to 130° C.

According to one embodiment of the present invention, the third temperature ranges from 140° C. to 160° C.

Another aspect of the present invention is to provide a method of manufacturing chip package. The method includes steps of providing a wafer having a first surface and a second surface opposite thereto, in which the wafer comprising a plurality of conductive bumps disposed on the first surface; forming a first adhesion layer and a first carrier board covering the conductive bumps and the first surface, in which the first adhesion layer is disposed between the first carrier board and the first surface; thinning the wafer from the second surface toward the first surface; forming a first insulating layer covering the second surface; forming a second adhesion layer and a second carrier board covering the first insulating layer, in which the second adhesion layer is disposed between the second carrier board and the first insulating layer; heating the first adhesion layer to a first temperature, such that the first carrier board and the first adhesion layer are removed; forming a plurality of trenches penetrating through the wafer; forming a second insulating layer filling the trenches and covering the first surface, and the conductive bumps are exposed from the second insulating layer; forming a third adhesion layer and a third carrier board covering the conductive bumps, in which the third adhesion layer is disposed between the third carrier board and the conductive bumps; heating the second adhesion layer to a second temperature, such that the second carrier board and the second adhesion layer are removed; heating the third adhesion layer to a third temperature, such that the third carrier board and the third adhesion layer are removed; and dicing the first insulating layer and the second insulating layer along each trench to form a plurality of chip packages.

According to one embodiment of the present invention, during the step of forming the second insulating layer, the second insulating layer further covers a sidewall of the wafer.

According to one embodiment of the present invention, after the step of heating the second adhesion layer to the second temperature and before the step of heating the third adhesion layer to the third temperature, the method further includes forming a laser mark on the first insulating layer.

According to one embodiment of the present invention, the first temperature ranges from 70° C. to 90° C.

According to one embodiment of the present invention, the second temperature ranges from 110° C. to 130° C.

According to one embodiment of the present invention, the third temperature ranges from 140° C. to 160° C.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
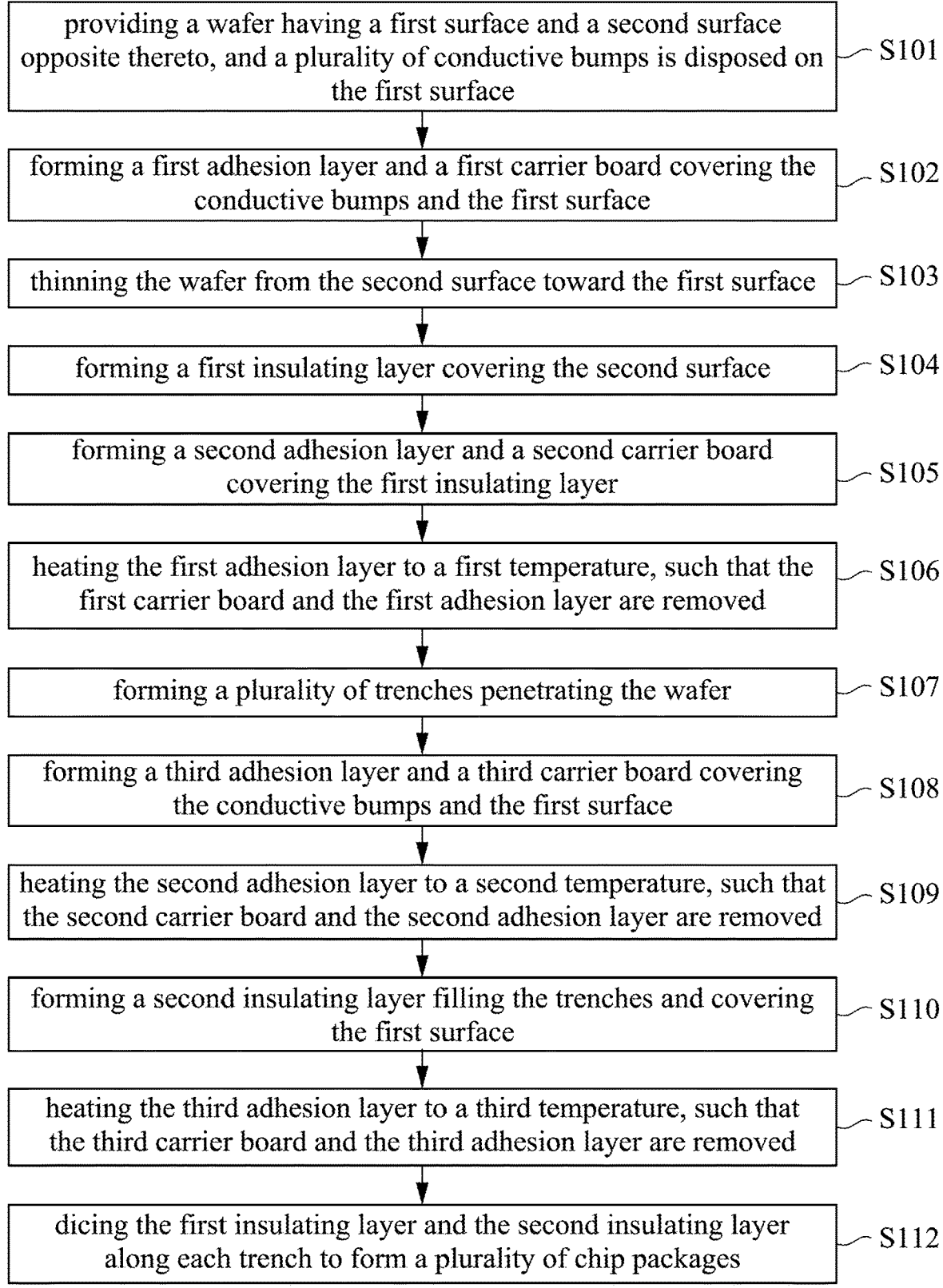
FIG. 1 depicts a flowchart of a method of manufacturing chip packages according to one embodiment of the present invention.

The following disclosure provides many different embodiments, or examples, for implementing different features of the provided subject matter. Specific examples of components and arrangements are described below to simplify the present disclosure. These are, of course, merely examples and are not intended to be limiting. Other embodiments may be added to an embodiment without further description.

In the following description, certain specific details are set forth in order to provide a thorough understanding of various embodiments of the invention. However, one skilled in the art will understand that the invention may be practiced without these specific details. In other instances, well-known structures and devices are only schematically illustrated in the drawings in order to simplify the drawings.

One aspect of the present invention is to provide a method of manufacturing chip packages. The method may reduce the process duration and costs, and the alignment offset issue can be eliminated. FIG. 1 depicts a flowchart of a method of manufacturing chip packages according to one embodiment of the present invention. FIG. 3 through FIG. 14 are schematic sectional views of intermediate stages in the manufacturing of chip packages according to one embodiment of the present invention. As shown in FIG. 1, the method 100 includes step S101, step S102, step S103, step S104, step S105, step S106, step S107, step S108, step S109, step S110, step S111, and step S112.

Figure 3:
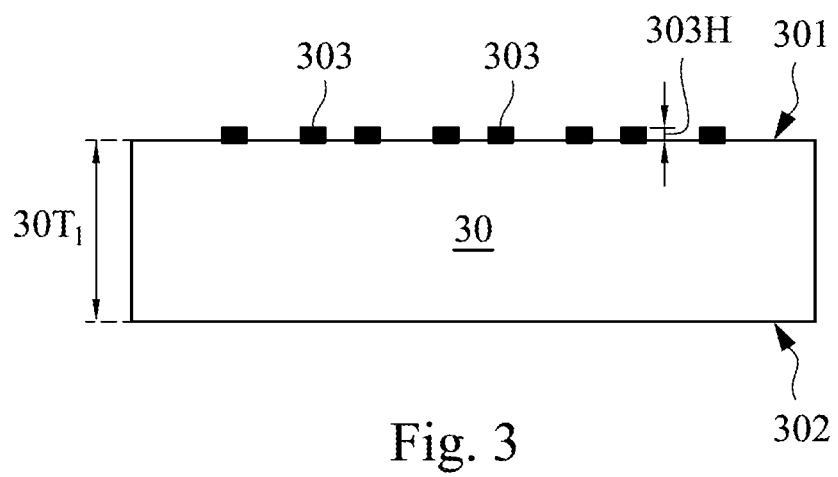
FIGS. 3 through 14 are schematic sectional views of intermediate stages in the manufacturing of chip packages according to one embodiment of the present invention.

At step S101, a wafer 30 is provided, as shown in FIG. 3. Specifically, the wafer 30 has a first surface 301 and a second surface 302 opposite thereto. In addition, the wafer 30 includes a plurality of conductive bumps 303 disposed on the first surface 301. In one example, the wafer 30 may include silicon, germanium, or a Group III to Group V element, but is not limited thereto. In some examples, the wafer 30 includes a plurality of conductive pads (not shown) disposed on the first surface 301, and the conductive bumps 303 are disposed on the conductive pads. In some examples, a thickness $30T_1$ of the wafer 30 may range from 525 μm to 725 μm, such as 550 μm, 575 μm, 600 μm, 625 μm, 650 μm, 675 μm, or 700 μm.

In one example, a height 303H of each conductive bump 303 may range from 20 μm to 45 μm, such as 22 μm, 24 μm, 26 μm, 28 μm, 30 μm, 32 μm, 34 μm, 36 μm, 38 μm, 40 μm, 42 μm, or 44 μm. In some examples, the conductive bumps 303 may be formed by the following steps. First, a patterned mask (not shown) is formed on the first surface 301 of the wafer 30. The patterned mask has a plurality of openings (not shown) exposing a portion of the first surface 301. Next, the conductive bumps 303 are formed in the openings by an electroplating process. In some examples, the conductive bumps 303 include gold, tin, copper, nickel, or other suitable metal material.

In some examples, a surface treatment layer (not shown) may be formed on the conductive bumps 303. In some examples, the surface treatment layer may be a single-layered structure or a multilayered structure composed of sublayers of different materials, such as a tin layer, a stacked metal layer including a nickel layer and a gold layer on the nickel layer, or the like, but is not limited thereto. The surface treatment layer may be formed by a physical process such as an electrolytic gold/nickel process and a hot air solder leveling process, or a chemical process such as an electroless nickel immersion gold (ENIG) process, but is not limited thereto. The surface treatment layer may prevent the conductive bumps 303 from being oxidized by the air.

Figure 4:
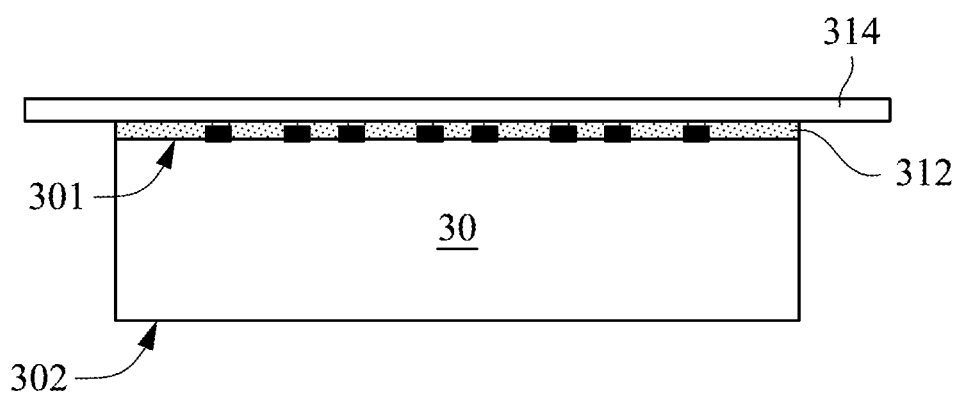

At step S102, the first adhesion layer 312 and the first carrier board 314 are formed covering the conductive bumps 303 and the first surface 301, as shown in FIG. 4. Specifically, the first adhesion layer 312 is disposed between the first carrier board 314 and the first surface 301. The first adhesion layer 312 may reduce the stress occurred during the subsequent thinning process, thus reducing the risk of wafer cracking. In one example, the first adhesion layer 312 includes a UV release adhesive or a thermal release adhesive. It is noted that a pyrolysis temperature of the first adhesion layer 312 is about 70° C. to 90° C., such as 72° C., 75° C., 77° C., 80° C., 82° C., 85° C., or 87° C. In one example, the first adhesion layer 312 may be formed by a spin coating process, but is not limited thereto. The first carrier board 314 may provide excellent protection for the wafer 30, and the first carrier board 314 may be a rigid insulating substrate, such as a glass substrate, a ceramic substrate, a sapphire substrate, or a quartz substrate, but is not limited thereto.

Figure 5:
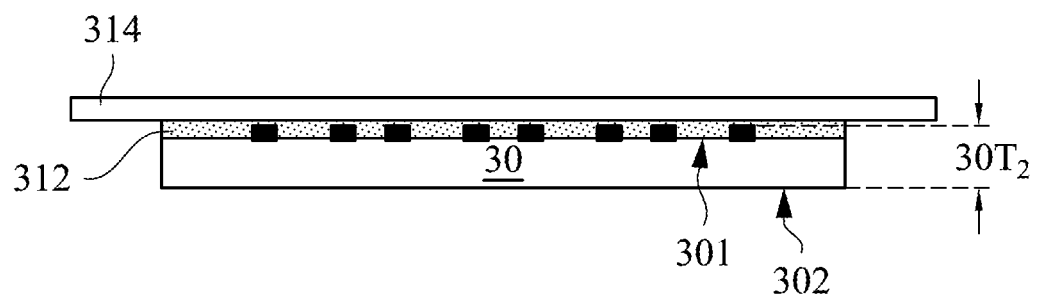

At step S103, the wafer 30 is thinned from the second surface 302 toward the first surface 301, as shown in FIG. 5. The wafer 30 may be thinned by a chemical-mechanical polishing process, a dry etching process or other suitable processes, such that the subsequently formed chip package may have a smaller size. In some examples, after performing the step S103 by thinning the wafer 30, the thickness $30T_2$ of the wafer 30 may range from 100 μm to 200 μm, such as 110 μm, 120 μm, 130 μm, 140 μm, 150 μm, 160 μm, 170 μm, 180 μm, or 190 μm.

Figure 6:
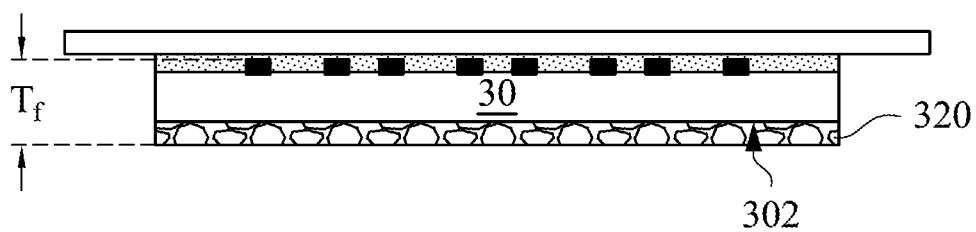

At step S104, a first insulating layer 320 is formed covering the second surface 302, as shown in FIG. 6. The first insulating layer 320 may serve as a sealing layer of the chip package to protect the second surface 302 of the wafer 30. In some examples, the first insulating layer 320 may be made of polyimide, epoxy, or other suitable insulating material. In one example, the first insulating layer 320 may be formed by a printing process or a spin-coating process, but is not limited thereto. In the present example, when step S104 is completed, in which the first insulating layer 320 has been formed, the total thickness $T_f$ of the wafer 30 and the first insulating layer 320 may range from 120 μm to 210 μm, such as 125 μm, 130 μm, 135 μm, 140 μm, 145 μm, 150 μm, 155 μm, 160 μm, 165 μm, 170 μm, 175 μm, 180 μm, 185 μm, 190 μm, 195 μm, 200 μm, or 205 μm.

Figure 7:
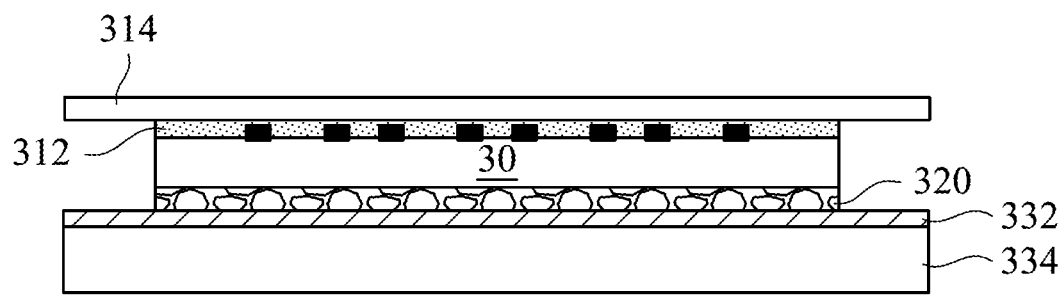

At step S105, a second adhesion layer 332 and a second carrier board 334 are formed covering the first insulating layer 320, as shown in FIG. 7. Specifically, the second adhesion layer 332 is disposed between the second carrier board 334 and the first insulating layer 320. The second adhesion layer 332 may reduce the stress occurred during the subsequent formation of trenches, thus reducing the risk of wafer cracking. In one example, the second adhesion layer 332 includes a UV release adhesive or a thermal release adhesive. It is noted that a pyrolysis temperature of the second adhesion layer 332 ranges from about 110° C. to 130° C., such as 112° C., 115° C., 117° C., 120° C., 122° C., 125° C., or 127° C. In one example, the second adhesion layer 332 may be formed by a spin coating process, but is not limited thereto. The second carrier board 334 may provide excellent protection for the wafer 30, and the second carrier board 334 may be a rigid insulating substrate, such as a glass substrate, a ceramic substrate, a sapphire substrate, or a quartz substrate, but is not limited thereto.

Figure 8:
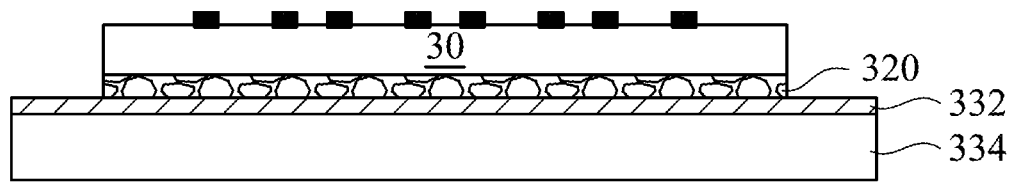

At step S106, the first adhesion layer 312 is heated to a first temperature T1, such that the first carrier board 314 and the first adhesion layer 312 are removed from the wafer 30, as shown in FIG. 8. In one example, the first temperature T1 ranges from 70° C. to 90° C., such as 72° C., 75° C., 77° C., 80° C., 82° C., 85° C., or 87° C. In detail, a pyrolysis temperature of the first adhesion layer 312 ranges from about 70° C. to 90° C., and a pyrolysis temperature of the second adhesion layer 332 ranges from about 110° C. to 130° C. Therefore, in the case the first adhesion layer 312 is heated to the first temperature T1 (that is, 70° C. to 90° C.), the first carrier board 314 may be released as the adhesion of the first adhesion layer 312 is decreased, while the second carrier board 334 is still bonded to the first insulating layer 320 via the second adhesion layer 332.

Figure 9:
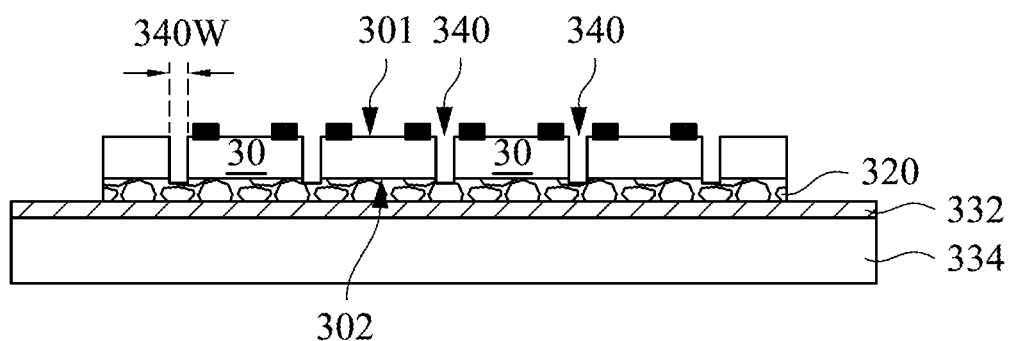

At step S107, a plurality of trenches 340 is formed to penetrate through the wafer 30, as shown in FIG. 9. Specifically, each trench 340 penetrates through the wafer 30 from the first surface 301 to second surface 302, but the trenches 340 do not pass through the first insulating layer 320. After the step S107 is completed, the wafer 30 is diced into a plurality of chips, and the relative positions of the chips are kept unchanged because of the presence of the first insulating layer 320. In this way, the alignment offset issue in the prior art may be eliminated. In some examples, the step S107 may be done by a wheel cutting process, a laser cutting process, or a waterjet cutting process. In one example, the width 340W of each trench 340 ranges from 50 μm to 60 μm, such as 51 μm, 52 μm, 53 μm, 54 μm, 55 μm, 56 μm, 57 μm, 58 μm, or 59 μm, but is not limited thereto.

Figure 10:
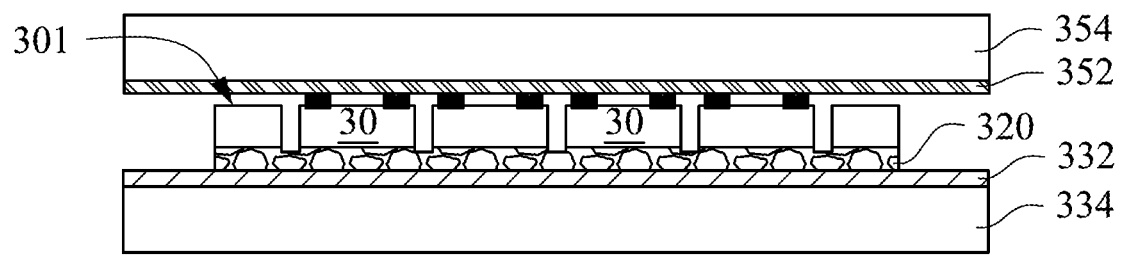

At step S108, a third adhesion layer 352 and a third carrier board 354 are formed covering the conductive bumps 303, as shown in FIG. 10. Specifically, the third adhesion layer 352 is disposed between the third carrier board 354 and the conductive bumps 303. In some examples, as shown in FIG. 10, the third adhesion layer 352 and the first surface 301 of the wafer 30 are spaced apart by a distance. In other examples, the third adhesion layer 352 is in direct contact with the first surface 301 of the wafer 30. In one example, the third adhesion layer 352 includes a UV release adhesive or a thermal release adhesive. It is noted that a pyrolysis temperature of the third adhesion layer 352 ranges from about 140° C. to 160° C., such as 142° C., 145° C., 147° C., 150° C., 152° C., 155° C., or 157° C. In one example, the third adhesion layer 352 may be formed by a spin coating process, but is not limited thereto. The third carrier board 354 may serve as a support in the subsequent formation of the second insulating layer. In one example, the third carrier board 354 may be a rigid insulating substrate, such as a glass substrate, a ceramic substrate, a sapphire substrate, or a quartz substrate, but is not limited thereto. Further, after the step S108 is completed, the structure illustrated in FIG. 10 is flipped upside down, such that the third carrier board 354 is under the second carrier board 334 to facilitate the subsequent processes.

Figure 11:
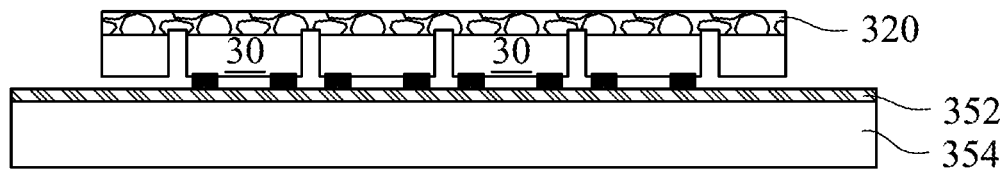

At step S109, the second adhesion layer 332 is heated to a second temperature T2, such that the second carrier board 334 and the second adhesion layer 332 are removed from the first insulating layer 320, as shown in FIG. 11. In one example, the second temperature T2 may range from 110° C. to 130° C., such as 112° C., 115° C., 117° C., 120° C., 122° C., 125° C., or 127° C. In detail, a pyrolysis temperature of the second adhesion layer 332 ranges from about 110° C. to 130° C., while a pyrolysis temperature of the third adhesion layer 352 ranges from about 140° C. to 160° C. In the case the second adhesion layer 332 is heated to the second temperature T2 (that is, 110° C. to 130° C.), the second carrier board 334 may be released as the adhesion of the second adhesion layer 332 is decreased, while the third carrier board 354 is still bonded to the surface of the conductive bumps 303 via the third adhesion layer 352.

Figure 12:
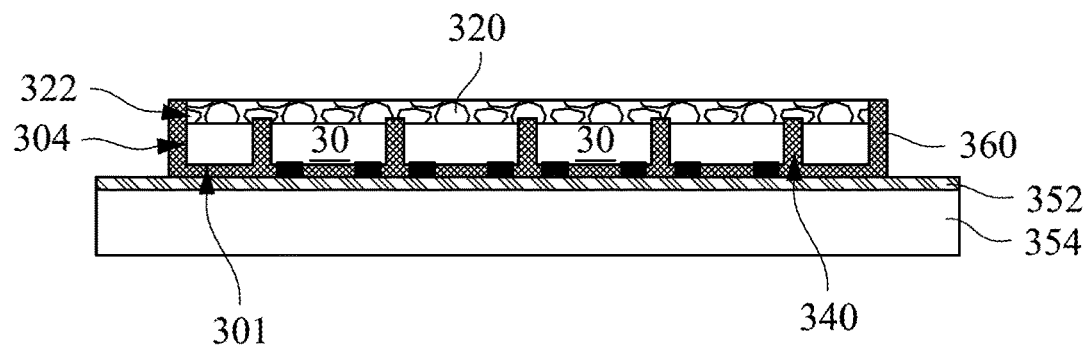

At step S110, a second insulating layer 360 is formed to fill the trenches 340 and cover the first surface 301, as shown in FIG. 12. The second insulating layer 360 may serve as a sealing layer of the chip package to protect the first surface 301 of the wafer 30. In some embodiments, the second insulating layer 360 further covers sidewalls 322 of the first insulating layer 320 and sidewalls 304 of the wafer 30. In one example, the second insulating layer 360 may be made of polyimide, epoxy, or other suitable insulating material. In one example, the second insulating layer 360 may be formed by an underfill dispensing process.

In some examples, after the step S110 is completed, in which the second insulating layer 360 has been formed, a laser mark (not shown) may be formed on the first insulating layer 320 for each chip to label the product name of the manufactured chip package.

Figure 13:
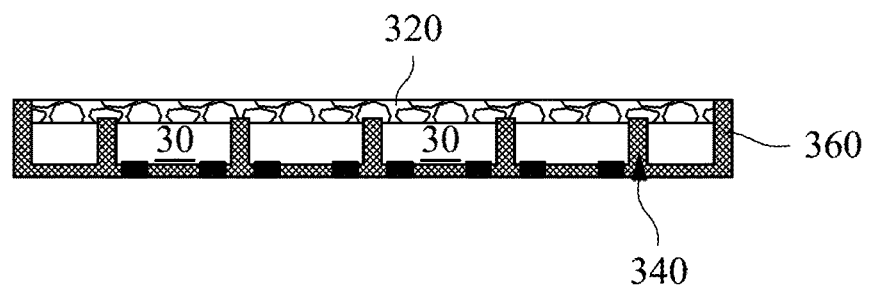

At step S111, the third adhesion layer 352 is heated to a third temperature T3, such that the third carrier board 354 and the third adhesion layer 352 are removed from the wafer 30, as shown in FIG. 13. In one example, the third temperature T3 ranges from 140° C. to 160° C., such as 142° C., 145° C., 147° C., 150° C., 152° C., 155° C., or 157° C. In detail, a pyrolysis temperature of the third adhesion layer 352 ranges from about 140° C. to 160° C., Therefore in the case the third adhesion layer 352 is heated to the third temperature T3 (that is, 140° C. to 160° C.), the third carrier board 354 may be released as the adhesion of the third adhesion layer 352 is decreased. Since the third adhesion layer 352 is adhered to the surface of the conductive bumps 303, the surface of conductive bumps 303 are exposed after the third carrier board 354 and the third adhesion layer 352 are released.

Figure 14:
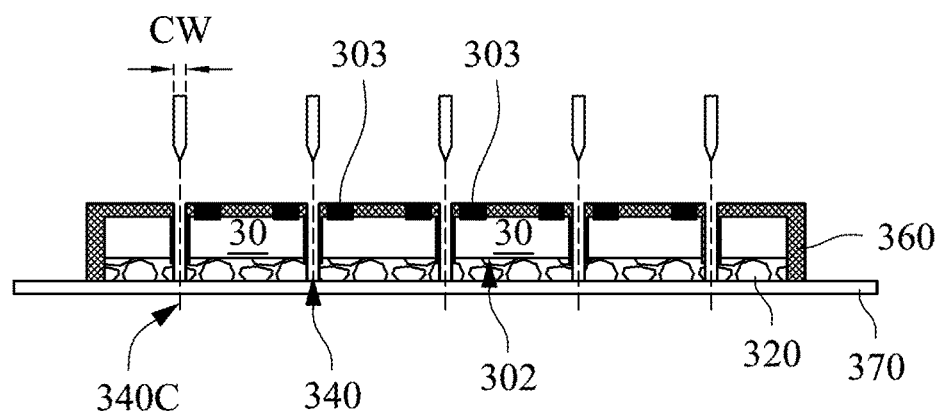

At step S112, the first insulating layer 320 and the second insulating layer 360 are diced along each trench 340 to form a plurality of chip packages, as shown in FIG. 14. In some examples, the step S112 may be done by a wheel cutting process, a laser cutting process, or a waterjet cutting process. In the present example, the first insulating layer 320 and the second insulating layer 360 are diced along a center 340C of each trench 340. In one example, a dicing width CW in step S112 ranges from 18 μm to 22 μm, such as 18.5 μm, 19.0 μm, 19.5 μm, 20.0 μm, 20.5 μm, 21.0 μm, or 21.5 μm. It is noted that because the dicing width CW is smaller than a width 304W of each trench 304, when the step S112 is completed, a portion of the second insulating layer 360 remains on sidewalls of each chip package, adjacent to the center 304C, to protect the wafer 30. In other words, every surface of the chip package is protected by the first insulating layer 320 and/or the second insulating layer 360, and only the conductive bumps 303 is exposed, which is to be electrically connected to other components. In other embodiments, as shown in FIG. 14, before the step S112 is conducted, the structure depicted in FIG. 13 may be flipped upside down and disposed on a dicing tape 370. Next, the step S112 is conducted, in which the first insulating layer 320 and the second insulating layer 360 are diced. More specifically, the first insulating layer 320 is disposed between the second surface 302 of the wafer 30 and the dicing tape 370. In some examples, the dicing tape 370 may be a blue tape (i.e., blue UV tape).

Figure 2:
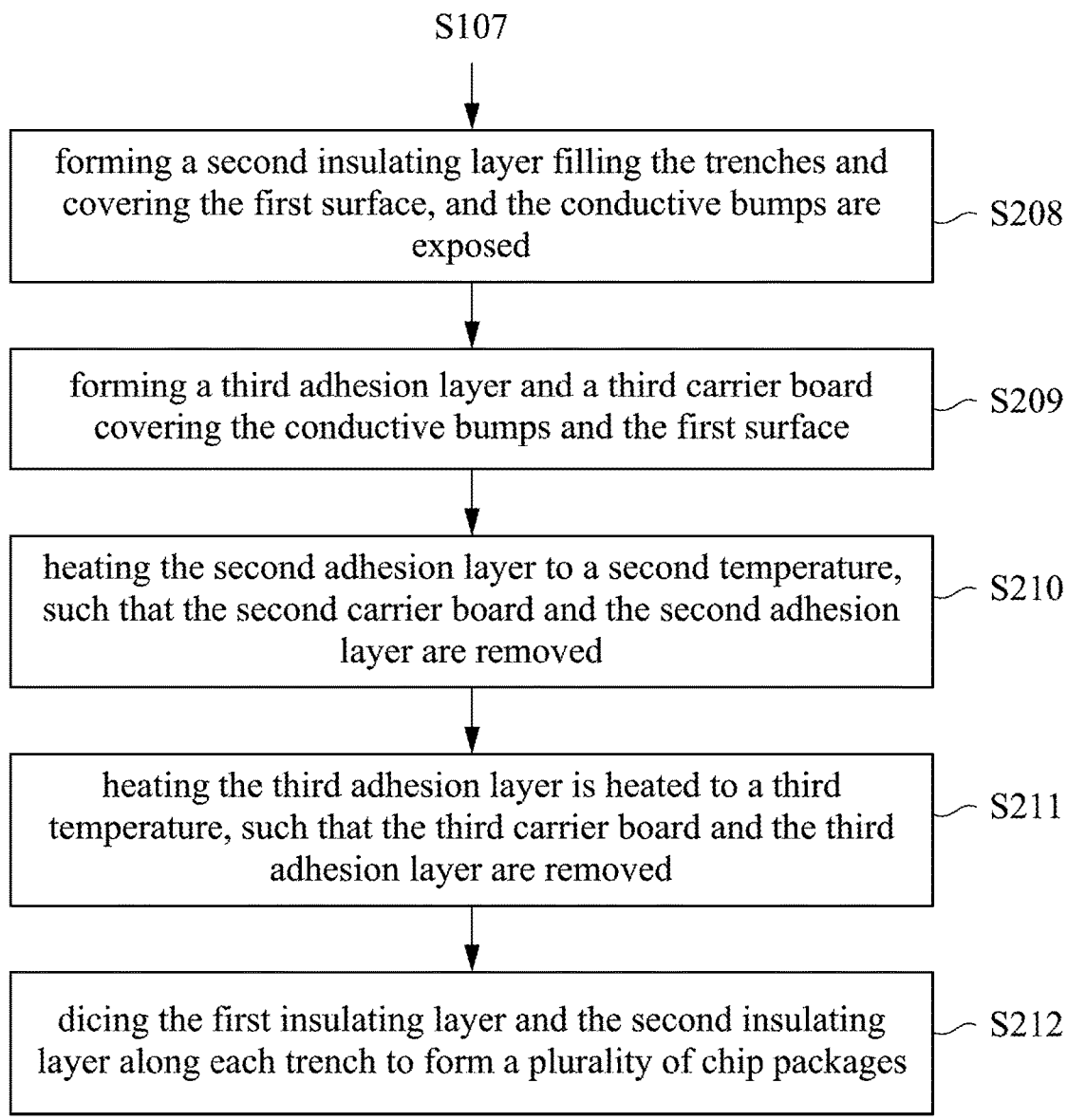
FIG. 2 depicts a flowchart of a method of manufacturing chip packages according to another embodiment of the present invention.

Hereinafter, a method of manufacturing a chip package according to another embodiment of the present invention is described. FIG. 2 depicts a flowchart of the method of manufacturing a chip package according to another embodiment of the present invention. FIGS. 15 through 18 are schematic sectional views of intermediate stages in the manufacturing of chip packages according to another embodiment of the present invention. As shown in FIG. 2, a method 200 includes step S101 to step S107, step S208, step S209, step S210, step S211, and step S212. The details of step S101 to step S107 are provided above and therefore are not repeated herein.

Figure 15:
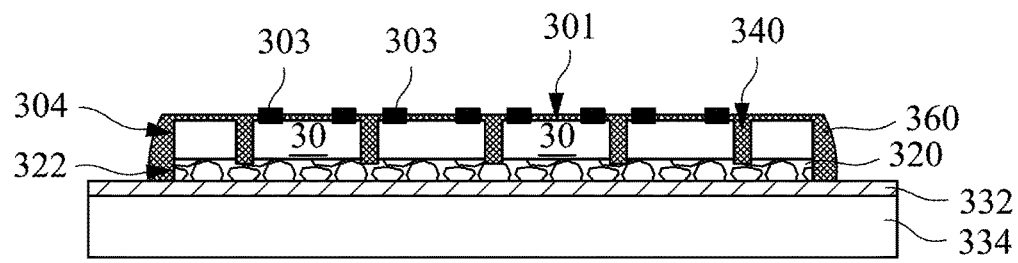
FIGS. 15 through 18 are schematic sectional views of intermediate stages in the manufacturing of chip packages according to another embodiment of the present invention.

Reference is made to FIG. 15. The step S208 is conducted after the step S107 is completed. A second insulating layer 360 is formed filling the trenches 340 and covering the first surface 301. The conductive bumps 303 are exposed out of the second insulating layer 360. The second insulating layer 360 may serve as a sealing layer of the chip package to protect the chip package, in which the details are provided below. In some embodiments, the second insulating layer 360 further covers sidewalls 322 of the first insulating layer 320 and sidewalls 304 of the wafer 30. In some examples, the second insulating layer 360 may be made of polyimide, epoxy, or other suitable insulating material. In one example, the second insulating layer 360 may be formed by an underfill dispensing process. In addition, the trenches 340 may be filled by a printing process, a coating process, or a molding process, and the first surface 301 of the wafer 30 is completely covered. Next, a planarization process may be performed, such as a chemical mechanical polishing process, a mechanical abrasion process, a planarized chemical etching process, a polishing process, an electrolytic etching process or an electrolytic polishing etching process, and the like, such that the conductive bumps 303 are exposed from the second insulating layer 360.

Figure 16:
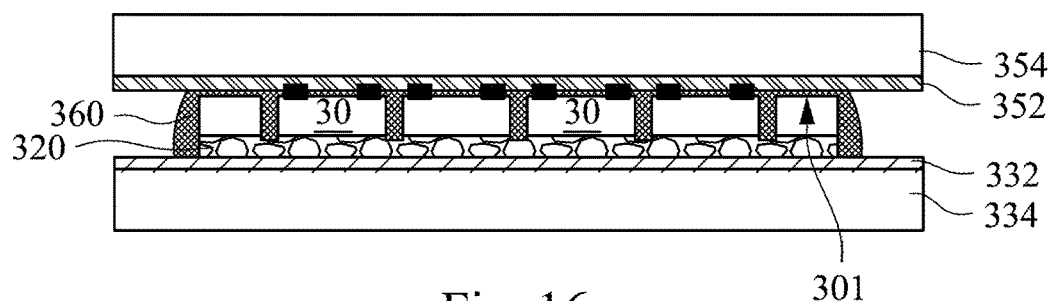

At step S209, a third adhesion layer 352 and a third carrier board 354 are formed covering the conductive bumps 303 and the first surface 301, as shown in FIG. 16. Specifically, the third adhesion layer 352 is disposed between the third carrier board 354 and the first surface 301. The details of the third adhesion layer 352 and the third carrier board 354 are provided above and therefore are not repeated herein. The third carrier board 354 may serve as a support during the subsequent formation of a laser mark to prevent the wafer 30 from warpage.

Figure 17:
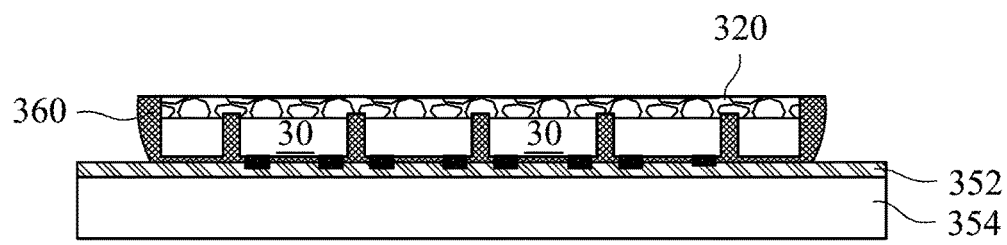

At step S210, the second adhesion layer 332 is heated to a second temperature T2, such that the second carrier board 334 and the second adhesion layer 332 are removed from the first insulating layer 320, as shown in FIG. 17. In one example, the second temperature T2 ranges from 110° C. to 130° C., such as 112° C., 115° C., 117° C., 120° C., 122° C., 125° C., or 127° C. In detail, a pyrolysis temperature of the second adhesion layer 332 ranges from about 110° C. to 130° C., while a pyrolysis temperature of the third adhesion layer 352 ranges from about 140° C. to 160° C. In the case the second adhesion layer 332 is heated to the second temperature T2 (that is, 110° C. to 130° C.), the second carrier board 334 may be released as the adhesion of the second adhesion layer 332 is decreased, while the third carrier board 354 is still bonded to the first surface 301 of the wafer 30 via the third adhesion layer 352.

In some examples, after the step S210 is completed, in which the second carrier board 334 and the second adhesion layer 332 are removed, a laser mark (not shown) may be formed on the first insulating layer 320 for each chip to label the product name of the formed chip package.

Figure 18:
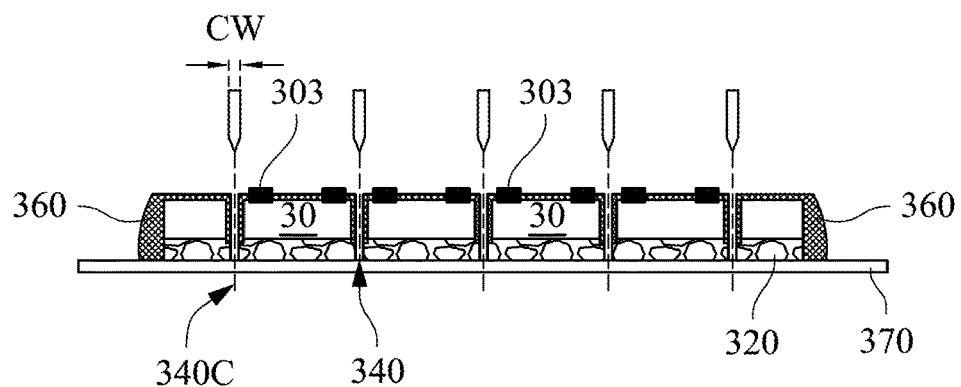

At step S211, the third adhesion layer 352 is heated to a third temperature T3, such that the third carrier board 354 and the third adhesion layer 352 are removed from the wafer 30, as shown in FIG. 18. In one example, the third temperature T3 ranges from 140° C. to 160° C., such as 142° C., 145° C., 147° C., 150° C., 152° C., 155° C., or 157° C. In detail, since the pyrolysis temperature of the third adhesion layer 352 ranges from about 140° C. to 160° C., and therefore in the case the third adhesion layer 352 is heated to the third temperature T3 (that is, 140° C. to 160° C.), the third carrier board 354 may be released as the adhesion of the third adhesion layer 352 is decreased.

At step S212, the first insulating layer 320 and the second insulating layer 360 are diced along each trench 340 to form a plurality of chip packages, as shown in FIG. 18. In some examples, the step S212 may be done by a wheel cutting process, a laser cutting process, or a waterjet cutting process. In the present example, the first insulating layer 320 and the second insulating layer 360 are diced along a center 340C of each trench 340. In one example, a dicing width CW in step S212 may range from 18 μm to 22 μm, such as 18.5 μm, 19.0 μm, 19.5 μm, 20.0 μm, 20.5 μm, 21.0 μm, or 21.5 μm. It is noted that because the dicing width CW is smaller than a width 304W of each trench 304. Therefore when the step S212 is completed, a portion of the second insulating layer 360 remains on the sidewalls of each chip package, adjacent to the center 304C, to protect the wafer 30. In other words, every surface of the chip package is protected by the first insulating layer 320 and/or the second insulating layer 360, and only the conductive bumps 303 is exposed, which is to be electrically connected to other components. In other embodiments, as shown in FIG. 18, after the step S211 is completed, the first insulating layer 320 under the second surface 302 of the wafer 30 may be disposed on a dicing tape 370. Next, the step S212 is performed, in which the first insulating layer 320 and the second insulating layer 360 are diced. More specifically, the first insulating layer 320 is disposed between the second surface 302 of the wafer 30 and the dicing tape 370. In some examples, the dicing tape 370 may be a blue tape.

In various examples, the chip packages may be applied in light-sensing elements packaging or light-emitting elements packaging, but the application is not limited thereto. For example, the chip packages may be applied in electronic components of various integrated circuits that including discrete components, active or passive elements, digital or analog circuits, for example optoelectronic devices, micro electro mechanical system (MEMS), microfluidic systems, or physical sensors that measures the variation of some physical quantities such as heat, light, or pressure. Notably, a wafer scale package process (WSP) process may be applied for packaging semiconductor chips such as image-sensing elements, light-emitting diodes (LEDs) or non-light-emitting diodes, solar cells, RF circuits, accelerators, gyroscopes, micro actuators, surface acoustic wave devices, process sensors, or ink printer heads, and the like.

In summary, the method of manufacturing chip packages disclosed in the present invention may reduce the process duration and costs, and the alignment offset can be eliminated.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing chip package, comprising steps of:
   providing a wafer having a first surface and a second surface opposite thereto, the wafer comprising a plurality of conductive bumps disposed on the first surface;
   forming a first adhesion layer and a first carrier board covering the conductive bumps and the first surface, wherein the first adhesion layer is disposed between the first carrier board and the first surface;
   thinning the wafer from the second surface toward the first surface;
   forming a first insulating layer covering the second surface;
   forming a second adhesion layer and a second carrier board covering the first insulating layer, wherein the second adhesion layer is disposed between the second carrier board and the first insulating layer;
   heating the first adhesion layer to a first temperature, such that the first carrier board and the first adhesion layer are removed;
   forming a plurality of trenches penetrating through the wafer to expose the first insulating layer;
   forming a third adhesion layer and a third carrier board covering the conductive bumps and the trenches, wherein the third adhesion layer is disposed between the third carrier board and the conductive bumps;
   heating the second adhesion layer to a second temperature, such that the second carrier board and the second adhesion layer are removed;
   forming a second insulating layer between the first insulating layer and the third adhesion layer to fill the trenches and cover the first surface;
   heating the third adhesion layer to a third temperature, such that the third carrier board and the third adhesion layer are removed; and
   dicing the first insulating layer and the second insulating layer along each trench to form a plurality of chip packages.

2. The method of claim 1, wherein during the step of forming the second insulating layer, the second insulating layer further covers a sidewall of the wafer and a sidewall of the first insulating layer.

3. The method of claim 1, wherein the first temperature ranges from 70° C. to 90° C.

4. The method of claim 1, wherein the second temperature ranges from 110° C. to 130° C.

5. The method of claim 1, wherein the third temperature ranges from 140° C. to 160° C.

6. A method of manufacturing chip package, comprising:
   providing a wafer having a first surface and a second surface opposite thereto, the wafer comprising a plurality of conductive bumps disposed on the first surface;
   forming a first adhesion layer and a first carrier board covering the conductive bumps and the first surface, wherein the first adhesion layer is disposed between the first carrier board and the first surface;
   thinning the wafer from the second surface toward the first surface;
   forming a first insulating layer covering the second surface;
   forming a second adhesion layer and a second carrier board covering the first insulating layer, wherein the second adhesion layer is disposed between the second carrier board and the first insulating layer;
   heating the first adhesion layer to a first temperature, such that the first carrier board and the first adhesion layer are removed;
   forming a plurality of trenches penetrating through the wafer;
   forming a second insulating layer filling the trenches and covering the first surface, and the conductive bumps are exposed from the second insulating layer;
   forming a third adhesion layer and a third carrier board covering the conductive bumps and the second insulating layer filled in the trenches, wherein the third adhesion layer is disposed between the third carrier board and the conductive bumps;
   heating the second adhesion layer to a second temperature, such that the second carrier board and the second adhesion layer are removed;
   heating the third adhesion layer to a third temperature, such that the third carrier board and the third adhesion layer are removed; and
   dicing the first insulating layer and the second insulating layer along each trench to form a plurality of chip packages.

7. The method of claim 6, wherein during the step of forming the second insulating layer, the second insulating layer further covers a sidewall of the wafer.

8. The method of claim 6, after the step of heating the second adhesion layer to the second temperature and before the step of heating the third adhesion layer to the third temperature, further comprising forming a laser mark on the first insulating layer.

9. The method of claim 6, wherein the first temperature ranges from 70° C. to 90° C.

10. The method of claim 6, wherein the second temperature ranges from 110° C. to 130° C.

11. The method of claim 6, wherein the third temperature ranges from 140° C. to 160° C.

* * * * *